(12) United States Patent
Huehne et al.

(10) Patent No.: US 6,496,556 B1
(45) Date of Patent: Dec. 17, 2002

(54) STEP-DOWN CLOCK CONTROL AND METHOD FOR IMPROVING CONVERGENCE FOR A DIGITALLY CONTROLLED SELF-CALIBRATING VCO

(75) Inventors: Karl J. Huehne, Mesa, AZ (US); Klaas Wortel, Phoenix, AZ (US); Luis J. Briones, Chandler, AZ (US)

(73) Assignee: Motorola, Inc., Schaumburg, IL (US)

( * ) Notice: Subject to any disclaimer, the term of this patent is extended or adjusted under 35 U.S.C. 154(b) by 0 days.

(21) Appl. No.: 10/047,189

(22) Filed: Jan. 15, 2002

(51) Int. Cl.$^7$ .............................................. H03K 21/00
(52) U.S. Cl. .............................. 377/2; 377/47; 327/147; 327/150; 327/159; 327/160; 331/16; 331/34; 331/36 R
(58) Field of Search ................................ 327/147, 150, 327/159, 160; 377/47, 2; 331/34, 36 R, 16

(56) References Cited

U.S. PATENT DOCUMENTS 6,133,797 A * 10/2000 Lovelace et al. ............. 331/17

* cited by examiner

Primary Examiner—Margaret R. Wambach

(57) ABSTRACT

A PLL system (200) includes a clock sequence generator (190). Clock sequence generator (190) provides a clock that steps down from a fast frequency through several steps to a frequency of zero. This step-down non-linear digression of frequencies causes a counter (110) driving a tank circuit of a self-calibrating VCO to achieve lock at an extremely rapid rate. The PFD (150) generates an analog signal based on the phase and frequency relationship of the reference and feedback clock signals. The analog signal is compared against an upper and lower reference voltage in a threshold detect circuit (120) and the signals UP and DOWN are supplied to the counter (110). The counter (110) provides a count value that controls the resonant frequency generated by the tank circuit. The convergence speed of the PLL system (200) is accelerated by the effects of the step-down clock provided by the clock sequence generator (190).

6 Claims, 2 Drawing Sheets

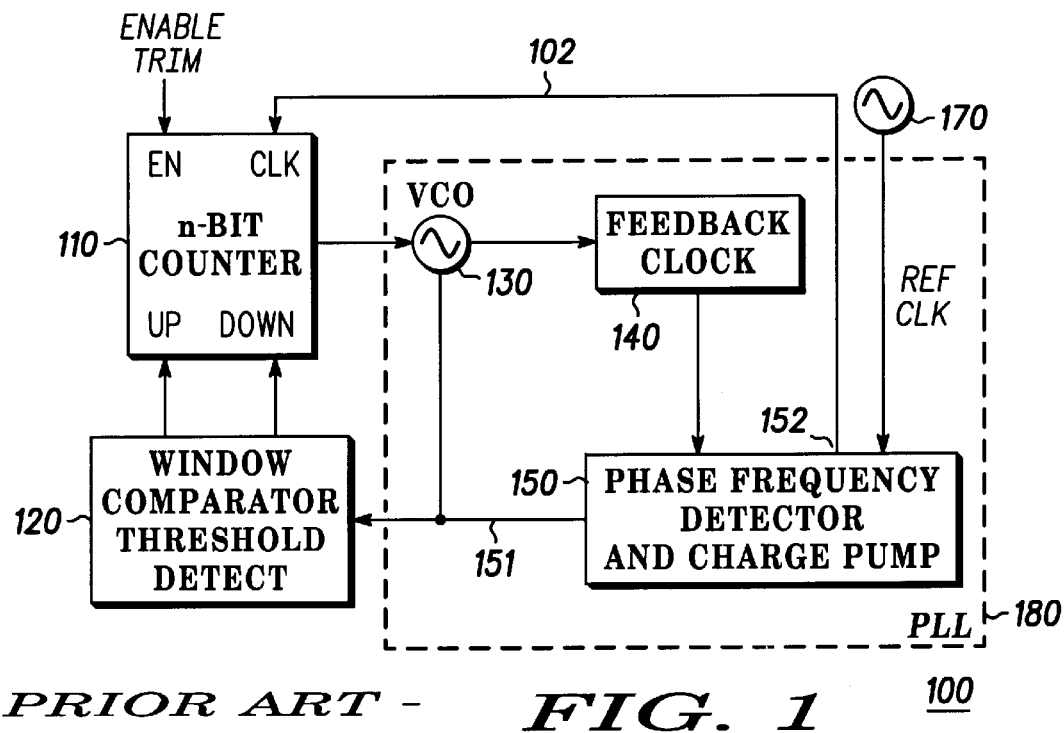
- PRIOR ART -  FIG. 1  100
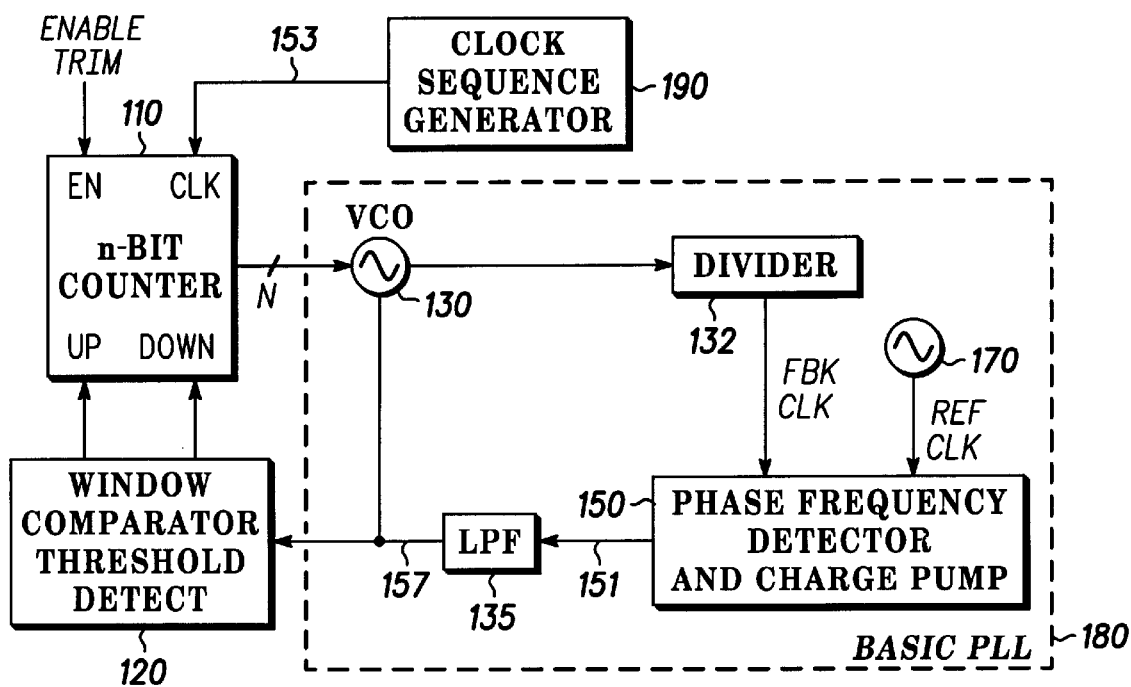
FIG. 2  200

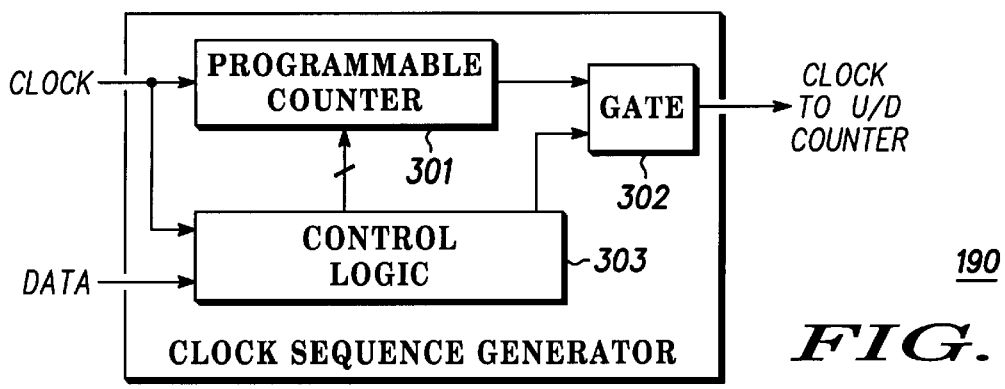
FIG. 3
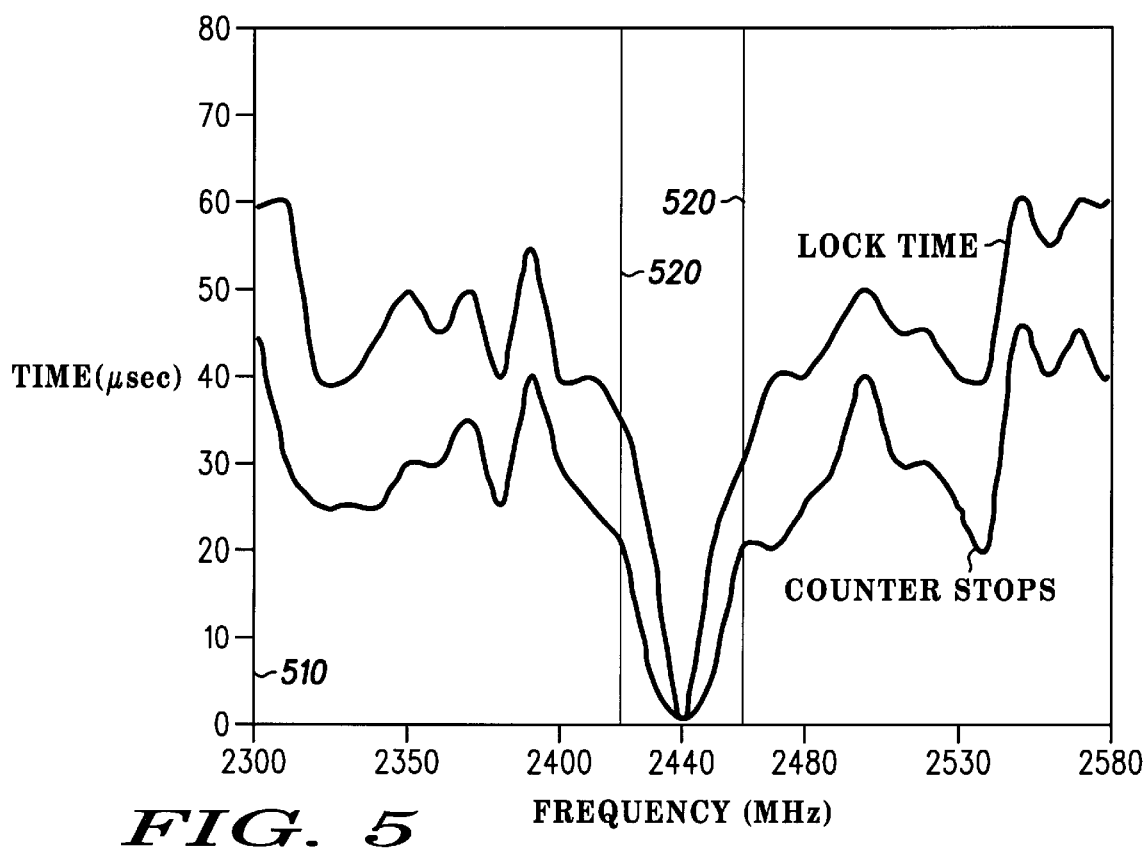
|  | DURATION | CLOCK FREQUENCY |
|---|---|---|
| 400 | 0 to 15μsec | 1.33 MHz |
| 410 | 15μsec to 30μsec | 667 kHz |
| 420 | 30μsec to 60μsec | 333 kHz |
| 430 | 60μsec to 120μsec | 167 kHz |
| 440 | 120μsec | 0 kHz |
FIG. 4
FIG. 5

STEP-DOWN CLOCK CONTROL AND METHOD FOR IMPROVING CONVERGENCE FOR A DIGITALLY CONTROLLED SELF-CALIBRATING VCO

BACKGROUND OF THE INVENTION

The present invention relates, in general, to Phase-Locked Loop (PLL) devices and, more particularly, to the tuning of a digitally controlled Voltage-Controlled Oscillator (VCO) in a PLL.

Phase-Locked Loops (PLLs) are widely used for clock generation or synchronization in data local area networks, data storage applications, disc drives, microprocessors, and communication systems. The PLL in communication systems and computer systems generally includes a phase detector, a loop filter, a Voltage-Controlled Oscillator (VCO), and a loop frequency divider. The phase detector receives a reference clock signal and a loop clock signal and provides a phase detect output signal that indicates the phase difference between the loop clock signal and the reference clock signal. The phase detect output signal is transferred to an input of the loop filter for generating a filtered signal to the VCO. The filtered signal provides a voltage to the VCO that adjusts the phase and frequency of the VCO output signal. The VCO output signal is typically scaled to a lower frequency by the loop frequency divider in generating the loop clock signal for the phase detector.

When the loop clock signal produced by the VCO is synchronized to the reference clock signal, these two signals have the desired phase-frequency relationship and the PLL is locked. If the loop clock signal and the reference clock signal are out of phase, the voltage generated by the phase detector is applied to the VCO for changing the capacitance value of a tank circuit and the resonant frequency at which the tank circuit oscillates. The dynamic adjustments to the voltage supplied to the VCO correct the frequency of the clock output signal to regain phase and frequency lock.

Typically, the capacitive and inductive components associated with the tank circuit vary over a range of values and component trimming is required to achieve the desired tuning of the VCO. Whether the capacitive and inductive components are integrated or discrete components, component tolerances are compensated through trimming which allows the voltage supplied by the phase detector a tuning range that is sufficient for the VCO to achieve phase lock for the PLL. The trimming adjusts the capacitive and/or inductive components to center the oscillator frequency. A limited operating supply voltage also limits the tuning range and necessitates component trimming, increasing the manufacturing cost due to additional steps and testing.

One method of trimming is to utilize an up/down counter in connection with a comparator for determining whether the tank circuit should be further tuned. The up/down counter can be controlled via its clock signal in addition to its up/down control bits. Typically, the phase detector drives the clock signal with a phase-differenced clock or, alternatively, an independent fixed frequency device may drive the clock of the up/down counter. Although these methods work for most applications, they fail to enable the VCO to tune to a frequency fast enough for some applications due to inherent problems caused by a fixed clock or a clock dependent on the phase detector. Accordingly, it would be advantageous to have a PLL device and a method for improving the tuning speed of the VCO by providing a better solution for driving the clock of the up/down counter for assisting the VCO to reach its lock in a specified time frame, especially when the initial frequency difference is large.

BRIEF DESCRIPTION OF THE DRAWINGS

FIG. 1 is a block diagram of a conventional phase-locked loop system with VCO trimming capability according to the prior art;

FIG. 2 is a block diagram of a phase-locked loop system including a clock sequence generator according to the invention;

FIG. 3 is a block diagram demonstrating an embodiment of a clock sequence generator according to the invention;

FIG. 4 is a table showing a sequence and duration of several steps for clock generated by a clock sequence generator; and FIG. 5 is a timing diagram demonstrating various lock times resulting from a step-down clock sequence as shown in FIG. 4.

DETAILED DESCRIPTION OF THE DRAWINGS

FIG. 1 is a block diagram of a Phase-Locked Loop (PLL) system 100 according to the prior art. PLL system 100 includes an N-bit Counter and Tank Circuit block 110. Although the tank circuit physically resides with the VCO block it is included here as part of the Counter for simplicity of explanation. Counter and Tank Circuit block 110 receives signals UP and DOWN from a Threshold Detect Circuit 120 and supplies an output for digitally tuning a Voltage Controlled Oscillator (VCO) 130. Additionally, counter and tank circuit block 110 receives a clock signal from a phase-frequency detector (PFD) and charge pump 150. PFD and charge pump 150 is a detector circuit that receives a reference clock signal from an oscillator 170 and a feedback clock signal from the VCO 130. The feedback clock is generally processed through a divider, not shown herein, before being received by the PFD and charge pump 150. PFD and charge pump 150 supplies a signal that is generally processed through a low pass filter (LPF), not shown herein, to both the VCO 130 and the threshold circuit or window comparator 120. PFD and charge pump 150 may include a phase slip detector for generating a clock signal at output 152 provided to the counter and tank circuit block 110. VCO 130 along with the PFD and charge pump make up a basic phase locked loop 180.

PFD/charge pump 150 provides an output signal at terminal 152 that indicates when the signals REF CLK and FBK CLK are not closely aligned. By way of example, when the signal REF CLK leads the signal FBK CLK and two low-to-high transitions of the signal REF CLK occur before a low-to-high transition of the signal FBK CLK, a logic one pulse is provided at terminal 152. In addition, when the signal REF CLK lags the signal FBK CLK and two low-to-high transitions of the signal FBK CLK occur before a low-to-high transition of the signal REF CLK, a logic zero pulse is provided at terminal 152. A pulse supplied at terminal 152 indicates at least a $2\pi$ (Pi)-phase difference between the signals REF CLK and FBK CLK.

This approach does provide an adaptive form of feedback in that a large difference between REF CLK and FBK CLK will result in a faster clock to the trim circuit. But in today's digital modulation systems, lock time must be minimized to maximize data throughput in the communications channel. This approach is not fast enough as phase differences slows down too quickly when the FBK CLK frequency approaches REF CLK causing the trimming to slow before necessary. What is needed is a mechanism for improving the lock time.

FIG. 2 is a block diagram of an embodiment of a phase correction circuit of PLL system 200 according to the invention. It should be noted that the same reference numbers are used in the figures to denote the same elements. In this embodiment, PLL system 200 includes an N-bit Counter and Tank Circuit block 110. As previously noted, the tank circuit actually physically resides in the VCO 130 but is included with the counter here for simplicity. Counter and Tank Circuit block 110 receives signals UP and DOWN from a Threshold Detect Circuit 120 and supplies an output for digitally tuning a Voltage Controlled Oscillator (VCO) 130. Additionally, counter and tank circuit block 110 receives a clock signal from a clock sequence generator 190. PFD and charge pump 150 is a detector circuit that receives a reference clock signal from an oscillator 170 and a feedback clock signal from the VCO 130. The feedback clock is processed through a divider 132 before being received by the PFD and charge pump 150. PFD and charge pump supplies a signal at its output 151 that is processed through a filter 135 and supplied to both the VCO 130 for voltage control and the threshold circuit or window comparator 120.

FIG. 3 is a schematic diagram of clock sequence generator 190 of FIG. 2 according to one embodiment. Clock sequence generator 190 includes a programmable counter 301 receiving control signals from a control logic block 303 and a system clock signal and supplying one of the inputs to a gate 302. The control logic block 303 receives the clock signal and data instructing it to reset or alter its control information and provides control signals to programmable counter 301 and gate 302. The gate 302 produces a clock signal that is fed into the counter and tank circuit block 110. The control logic 303 is designed to allow control over divide ratios, duration for producing a predetermined frequency and an end time for ceasing the supply of the clock to the counter and tank circuit block 110.

In operation, briefly referring to FIG. 2, PLL system 200 includes PFD/charge pump 150 for detecting the phase difference between selected edges of the signal REF CLK and the signal FBK CLK. Based on the detected phase difference, PFD/charge pump 150 generates an analog signal at terminal 151. By way of example, if the signal REF CLK leads the signal FBK CLK, then the analog value of the signal at terminal 151 is increased until the signal FBK CLK transitions. The signal REF CLK is said to be leading the signal FBK CLK when a selected transition of the signal REF CLK occurs before a selected transition of the signal FBK CLK. Thus, the signal at terminal 151 is increased during the time that the signal REF CLK leads the signal FBK CLK, i.e., the phase difference between the two signals. The loop filter provides a Direct Current (DC) signal by filtering out the Alternating Current (AC) component of the charge pump signal, leaving only the DC component of the charge pump signal. The amplitude of the DC signal is adjusted in accordance with the phase difference between signals REF CLK and FBK CLK.

On the other hand, the signal REF CLK is said to be lagging the signal FBK CLK when a selected transition of the signal REF CLK occurs after a selected transition of the signal FBK CLK. By way of example, if the signal REF CLK lags the signal FBK CLK, then the analog value of the signal at terminal 151 is decreased until the signal REF CLK transitions. Thus, the signal at terminal 151 is decreased during the time that the signal REF CLK lags the signal FBK CLK, i.e., the phase difference between the two signals.

The analog signal received by threshold detect circuit 120 from PFD/charge pump 150 is compared against an upper reference voltage and against a lower reference voltage. The upper reference voltage has a value that is less than $V_{CC}$ by several hundred millivolts and the lower reference voltage has a value that is greater than $V_{EE}$ (ground) by several hundred millivolts. When the analog signal received at terminal 151 has a value that is greater than the upper reference voltage, then threshold detector 120 supplies a detect signal UP having a logic one value. When the analog signal received at terminal 157 has a value that is less than the lower reference voltage, then threshold detector 120 supplies a detect signal DOWN having a logic one value. When the analog signal has a value that is between the upper reference voltage and the lower reference voltage, then threshold detector 120 supplies UP and DOWN signals having logic zero values.

The signals UP and DOWN are inputs of counter 110. In the preferred embodiment counter 110 is a four bit counter that generates output values ranging from 0000 (zero) to 1111 (fifteen). Counter 110 is initialized to a midrange value of either 0111 (seven) or 1000 (eight). This minimizes the time for the counter to get to its desired value. The number of bits chosen is dependent on the frequency resolution required by the digital tuning system. When the signal UP is received, counter 110 increments the count value from the current count value to the next higher count value. When the signal DOWN is received, counter 110 decrements the count value from the current count value to the next lower count value. It should be pointed out that counter 110 is not immediately clocked when the signals UP and DOWN are received, but rather, counter 110 is incremented or decremented based on a step down clock supplied by clock sequence generator 190 at terminal 153 that prevents clocking on spurious UP and DOWN signals.

The step down clock generator design is dependent on the system requirements and the VCO and PLL characteristics. In essence the parameters to be defined are: the number of steps required; the output frequency during each step; and the duration of each step. The Clock Sequence Generator is completely programmable in this respect within reasonable limits, allowing customization as other parameters of the basic PLL are modified to meet different operating requirements (e.g. software radio). An input reference clock is required, preferably relatively high in frequency so as to increase the programmable options. Such a clock is routinely available in modern digital communications systems. This clock in conjunction with the programmed values is divided down, often by factors of two, to provide the different output frequencies, and is also used by an internal counter to determine the duration of each step. At the end of the sequence the last timer will send a logic signal to the Gate 302 to stop the clock to the up/down counter.

FIG. 4 demonstrates an example of a step-down clock provided by the clock sequence generator 190. When the clock sequence generator is instructed that a tuning sequence is to begin, such as when the PLL frequency is to be changed, it begins generating its step-down clock. For the first step 400, it provides a clock running at a frequency of 1.33 MHz for 15 us. For the second step 410, it provides a clock running at a frequency of 667 kHz for 15 us. For the third step 420, it provides a clock running at a frequency of 333 kHz for 30 us. For the fourth step 430, it provides a clock running at a frequency of 167 kHz for 60 us and finally, the clock sequence generator ceases providing a clock after 120 us. Although the sequence demonstrated includes a first and second step running for 15 microseconds and the $3^{rd}$ step running for 30 us and the $4^{th}$ running for 60 us, the duration of each step as well as the frequency in each step can be designed according to the required usage of the self-calibrating VCO in which the clock sequence generator will be used.

FIG. 5 demonstrates an example of lock times produced by a self-calibrating PLL 200 according to the invention that uses the step-down sequence specified in FIG. 4. In the case 510 where the frequency difference is 140 MHz, the counter ceases to function after approximately 45 us and the VCO locks around 60 us. Similarly, if the frequency difference is 20 MHz case 520, the counter ceases to provide assistance after approximately 20 us and the VCO locks around approximately 30–35 us.

The count value provided by counter 110 determines the number of varactor sets within tank circuit included as part of the VCO 130 and not shown that are biased either on or off or high or low. The four control lines supplied from counter 110 to the tank circuit are used for controlling the four sets of binary weighted varactors.

The frequency at which the tank circuit resonates is set by the count value provided by counter 110 that controls the capacitance of the varactors, the analog value of the tuning signal that controls the capacitance of the varactors, the fixed capacitance, and the inductance. PLL system 100 dynamically adjusts the phase and frequency of the signal FBK CLK to match that of the signal REF CLK. By initializing counter 110 at its midrange, the tank circuit is initialized to a nominal frequency that can either be increased by decrementing counter 110 or decreased by incrementing counter 110 minimizing the time to get to the desired final value.

When the frequency difference is large, exterior circuitry or the trimming loop including the counter and threshold detect circuit work together to accelerate the basic PLL 180 to a frequency range where the basic PLL 180 can achieve lock without the exterior circuitry's further assistance. Ideally, the trimming loop ceases its assistance when the counter is not instructed to go either up or down or, alternatively, when a clock signal 153 is no longer received.

Prior art clock signal control methods often fail to achieve desired lock times because of inherent design inadequacies. When the clock is generated using feedback from the basic PLL 180 as illustrated in FIG. 1, the slip detection is based on a frequency difference between the VCO frequency and the reference frequency generating an ever slower random clock signal leading to intolerably long lock times. And, when the clock driving the counter is fixed at a low frequency, the lock times are too long for use in most designs and if the clock driving the counter is fixed at a high frequency, lock may never be achieved as the counter will overcorrect to a point that the circuit cannot get within the range where the basic PLL can achieve lock. A wider loop bandwidth is another approach, but this leads to higher noise in the system.

In the embodiment demonstrated in FIGS. 2 and 3, the clock sequence generator 190 is designed specifically to accelerate lock by causing the trimming circuitry to accomplish its task quicker and eliminate the randomness inherent in previous designs. The sequence generator provides a clock to the counter that steps down from a very fast frequency to zero in incremental steps. Each step is equal or slower in duration than the previous step and the frequency of each step is lower by a predetermined order of magnitude dependent on the requirements of the system.

By now it should be appreciated that the present invention provides a circuit and method for self calibrating a VCO and extending the tuning range of a PLL system. An analog signal generated by the phase detector is detected above an upper limit or below a lower limit and either an analog tuning voltage is added to the VCO or the capacitance in a tank circuit is adjusted.

What is claimed is:

1. A method of controlling a counter and tank circuit of a self-calibrating Voltage Controlled Oscillator (VCO) comprising providing a clock signal to the counter, wherein the clock signal frequency reduces by stepping down through a plurality of predetermined frequencies, each of the plurality of predetermined frequencies occurring for a predetermined time.

2. The method of claim 1, wherein the plurality of predetermined frequencies includes a last frequency wherein the last frequency is zero hertz.

3. The method of claim 1, wherein the plurality of predetermined frequencies includes a first frequency and a second frequency slower than the first frequency by a predetermined difference.

4. The method of claim 3, wherein the second frequency occurs for a predetermined duration that is longer than the first frequency.

5. A digital tuning circuit for a PLL having a digitally controlled voltage controlled oscillator ('VCO') comprising:
a clock sequence generator providing a clock signal with a frequency reduced by stepping down from a first frequency of a plurality of frequencies to a last frequency of the plurality of frequencies; and
a counter providing digital output control signals to the digitally controlled VCO according to the clock signal.

6. The circuit of claim 5 wherein the last frequency is zero.

* * * * *